(12) United States Patent
Kondo

(10) Patent No.: US 9,711,635 B1
(45) Date of Patent: Jul. 18, 2017

(54) SEMICONDUCTOR DEVICE

(71) Applicant: SANKEN ELECTRIC CO., LTD., Niiza-shi, Saitama (JP)

(72) Inventor: Taro Kondo, Saitama (JP)

(73) Assignee: Sanken Electric Co., LTD., Niiza-shi, Saitama (JP)

( * ) Notice: Subject to any disclaimer, the term of this patent is extended or adjusted under 35 U.S.C. 154(b) by 0 days.

(21) Appl. No.: 15/079,003

(22) Filed: Mar. 23, 2016

(51) Int. Cl.
| | | |
|---|---|---|
| *H01L 29/78* | (2006.01) | |
| *H01L 29/04* | (2006.01) | |
| *H01L 29/16* | (2006.01) | |
| *H01L 29/40* | (2006.01) | |
| *H01L 29/36* | (2006.01) | |

(52) U.S. Cl.
CPC .......... *H01L 29/7811* (2013.01); *H01L 29/04* (2013.01); *H01L 29/16* (2013.01); *H01L 29/36* (2013.01); *H01L 29/402* (2013.01)

(58) Field of Classification Search
CPC ......... H01L 29/04; H01L 29/16; H01L 29/36; H01L 29/402; H01L 29/7811
See application file for complete search history.

(56) References Cited

U.S. PATENT DOCUMENTS

| | | | | |
|---|---|---|---|---|
| 5,686,750 | A  * | 11/1997 | Takahashi | ........... H01L 29/7811 257/328 |
| 6,462,376 | B1 * | 10/2002 | Wahl | ..................... H01L 29/407 257/328 |
| 2003/0176031 | A1 * | 9/2003 | Onishi | ................ H01L 29/0634 438/200 |
| 2011/0073906 | A1 * | 3/2011 | Bobde | ................. H01L 29/7806 257/147 |
| 2014/0117439 | A1 |  5/2014 | Darwish et al. | |

FOREIGN PATENT DOCUMENTS

JP       2013-069852       4/2013

* cited by examiner

*Primary Examiner* — Allan R Wilson
(74) *Attorney, Agent, or Firm* — Banner & Witcoff, Ltd.

(57) ABSTRACT

A semiconductor device includes: a first semiconductor layer formed at a surface of a semiconductor substrate; an insulating layer formed on the surface of the semiconductor substrate; a first electrode that is electrically connected to the first semiconductor layer; a second semiconductor layer formed to a surface of a region, which is adjacent to the first semiconductor layer; a second electrode formed above a part of the second semiconductor layer; a third semiconductor layer adjacent to the second semiconductor layer in the one direction; a fourth semiconductor layer formed to a surface of a region, which is adjacent to the third semiconductor layer in the one direction; a third electrode that is electrically connected to the fourth semiconductor layer; and a conductor that is separated from the second electrode in the one direction and is kept at the same potential as the first electrode.

10 Claims, 4 Drawing Sheets

SEMICONDUCTOR DEVICE

TECHNICAL FIELD

This disclosure relates to a semiconductor device.

BACKGROUND

Demands for a power MOSFET have increased in the market of switching power-supply devices with a large current and a high withstand voltage. The power MOSFET is used for a DC-DC converter or a synchronous rectifier.

JP-A-2013-69852 and US 2014/0117439 disclose a MOSFET with a trench MOS structure as a technique of reducing on-resistance of a power MOSFET. The MOSFET with a trench MOS structure has a structure in which an N-type semiconductor layer connected to the drain electrode, a P-type semiconductor layer forming a channel, and an N-type semiconductor layer connected to the source electrode are arranged in the depth direction of a semiconductor substrate, and the gate electrode is embedded to be adjacent to the P-type semiconductor layer, with an insulating layer interposed therebetween, in the semiconductor substrate.

SUMMARY

In the power MOSFET having such trench MOS structure, resistance in a path of a current flowing from the drain to the source increases. Accordingly, it is difficult to realize characteristics such as low-voltage drive, low on-resistance, and high withstand voltages.

This disclosure is to provide a semiconductor device capable of easily realizing improved characteristics such as low-voltage drive, low on-resistance, and high withstand voltages.

According to this disclosure, a first semiconductor layer that has a first conductivity type and is formed at a surface of a semiconductor substrate; an insulating layer that is formed on the surface of the semiconductor substrate; a first electrode that is electrically connected to the first semiconductor layer; a second semiconductor layer that has a second conductivity type opposite to the first conductivity type and is formed from a region, which is adjacent to the first semiconductor layer in the semiconductor substrate in a depth direction perpendicular to the surface of the semiconductor substrate, to a surface of a region, which is adjacent to the first semiconductor layer in one direction parallel to the surface of the semiconductor substrate; a second electrode that is formed above a part of the second semiconductor layer, which is exposed to the insulating layer at the surface of the semiconductor substrate, with the insulating layer interposed therebetween; a third semiconductor layer that has the first conductivity type and is formed from a region, which is adjacent to the second semiconductor layer in the depth direction, to a surface of a region, which is adjacent to the second semiconductor layer in the one direction; a fourth semiconductor layer that has the first conductivity type with an impurity concentration higher than that of the third semiconductor layer and is formed from a region, which is adjacent to the third semiconductor layer in the depth direction, to a surface of a region, which is adjacent to the third semiconductor layer in the one direction; a third electrode that is electrically connected to the fourth semiconductor layer at a position closer to a back surface of the semiconductor substrate than an end portion of the third semiconductor layer on the back surface side of the semiconductor substrate in the depth direction; and a conductor that is separated from the second electrode in the one direction, is formed above a part of the third semiconductor layer, which is exposed to the insulating layer at the surface of the semiconductor substrate, with an insulating layer interposed therebetween, and is kept at the same potential as the first electrode.

According to this disclosure, it is possible to provide a semiconductor device capable of easily realizing improved characteristics such as low-voltage drive, low on-resistance, and high withstand voltage.

BRIEF DESCRIPTION OF THE DRAWINGS

The foregoing and additional features and characteristics of this disclosure will become more apparent from the following detailed descriptions considered with the reference to the accompanying drawings, wherein.

DETAILED DESCRIPTION

Hereinafter, embodiments of this disclosure will be described with reference to the accompanying drawings. In the following description, an N type is defined as a first conductivity type and a P type is defined as a second conductivity type.

Figure 1:
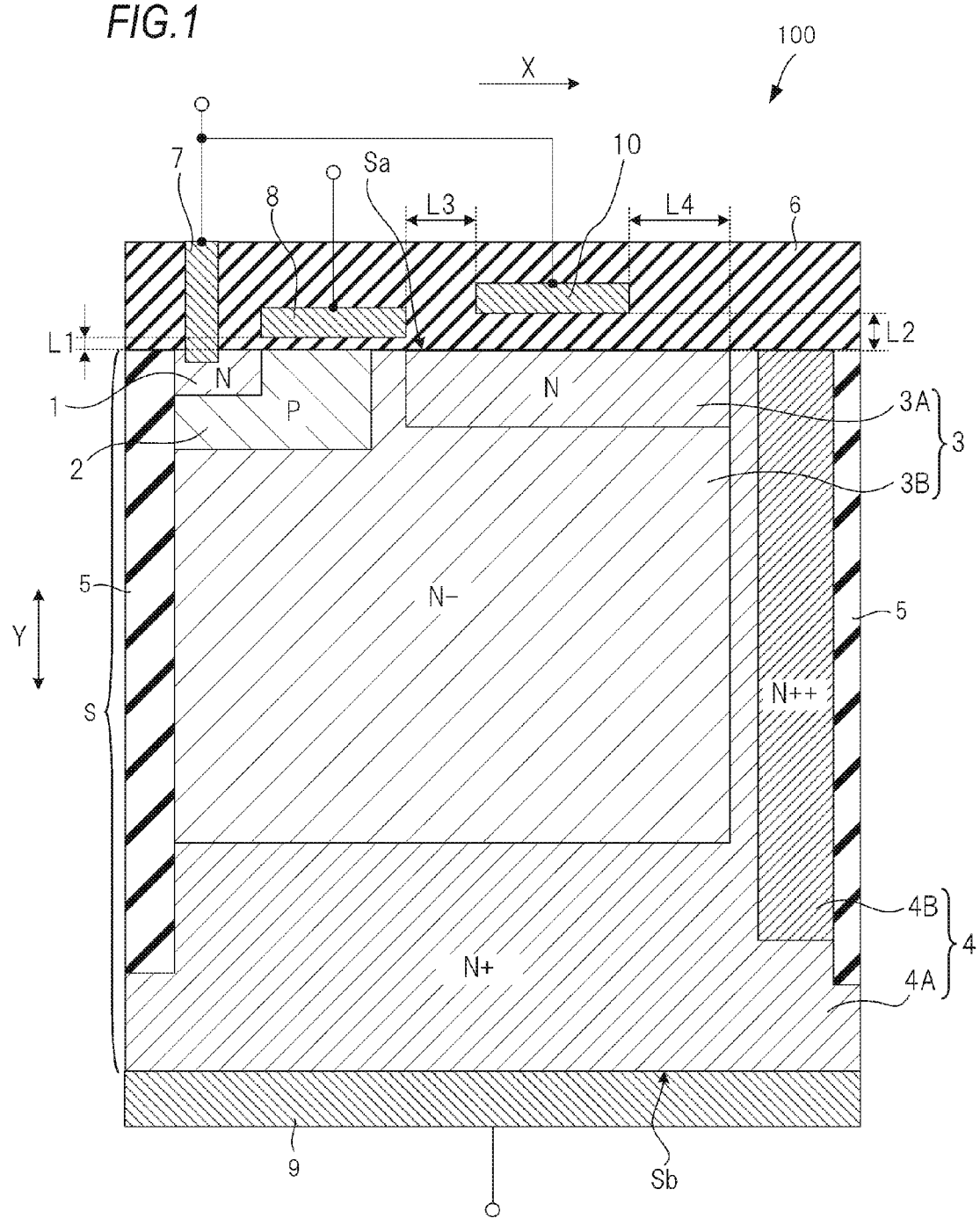
FIG. 1 is a schematic cross-sectional view illustrating a configuration of a MOSFET 100 which is an example of a semiconductor device according to this disclosure.

FIG. 1 is a schematic cross-sectional view illustrating a configuration of a MOSFET 100 which is an example of a semiconductor device according to this disclosure.

The MOSFET 100 includes an N-type semiconductor substrate S. In FIG. 1, a surface direction X which is one direction parallel to the surface of the semiconductor substrate S and a depth direction Y which is perpendicular to the surface of the semiconductor substrate S are illustrated.

An element isolation layer 5 made of an oxide film or the like is formed in the semiconductor substrate S. A first semiconductor layer 1, a second semiconductor layer 2, a third semiconductor layer 3, and a fourth semiconductor layer 4 which are formed by diffusion or growing impurities in the semiconductor substrate S are formed in a region of the semiconductor substrate S surrounded with the element isolation layer 5.

The MOSFET 100 further includes an insulating layer 6 which is formed at a surface Sa of the semiconductor substrate S, a source electrode 7, a gate electrode 8, a drain electrode, and a conductor 10.

The first semiconductor layer 1 is an N-type semiconductor layer which is formed at the surface Sa of the semiconductor substrate S.

The source electrode 7 made of an electrode material such as aluminum is connected to the first semiconductor layer 1. The source electrode 7 constitutes a first electrode which is electrically connected to the first semiconductor layer 1. The source electrode 7 is kept at a reference potential (for example, 0 V) via a wiring.

The second semiconductor layer 2 is a P-type semiconductor layer which is formed from a region adjacent to the first semiconductor layer 1 in the depth direction Y to the surface of a region adjacent to the first semiconductor layer 1 in the surface direction X.

Specifically, the second semiconductor layer 2 is a layer having a substantially L-shaped cross-section which extends from below the first semiconductor layer 1 to the surface Sa of the semiconductor substrate S along an end, which is distant from the surface Sa of the semiconductor substrate S among end portions in the depth direction Y of the first semiconductor layer 1 (i.e., end portion at a back surface (Sb) side of the semiconductor substrate)), and one end, which is among end portions in the surface direction X of the first semiconductor layer 1 (right end).

Above a part of the second semiconductor layer 2 which is exposed to the insulating layer 6 at the surface Sa of the semiconductor substrate S, the gate electrode 8 made of an electrode material such as aluminum is formed with the insulating layer 6 interposed therebetween. A wiring is connected to the gate electrode 8 and the potential of the gate electrode 8 is controlled via the wiring. The gate electrode 8 constitutes a second electrode.

The third semiconductor layer 3 is an N-type semiconductor layer which is formed from a region adjacent to the second semiconductor layer 2 in the depth direction Y to a surface of a region adjacent to the second semiconductor layer 2 in the surface direction X.

Specifically, the third semiconductor layer 3 is a layer having a substantially L-shaped cross-section which extends from below the second semiconductor layer 2 to the surface Sa of the semiconductor substrate S along an end portion (on the back surface (Sb) side of the semiconductor substrate S) distant from the surface Sa of the semiconductor substrate S among end portions in the depth direction Y of the second semiconductor layer 2 and an end portion (right end) distant from the first semiconductor layer among end portions in the surface direction X of the second semiconductor layer 2.

In the example illustrated in FIG. 1, the third semiconductor layer 3 includes an N-type semiconductor layer 3B and an N-type semiconductor layer 3A, which is formed at the surface of the N-type semiconductor layer 3B and has an impurity concentration higher than that of the N-type semiconductor layer 3B. The N-type semiconductor layer 3A is separated from the second semiconductor layer 2 and is formed at a surface of a region in a right side of the second semiconductor layer 2 in the N-type semiconductor layer 3B so as to be. The third semiconductor layer 3 may include only the N-type semiconductor layer 3B.

Above a part of the third semiconductor layer 3 which is exposed to the insulating layer 6 at the surface Sa of the semiconductor substrate S, the conductor 10 is formed with the insulating layer 6 interposed therebetween at a position separated from the gate electrode 8 in the surface direction X.

The conductor 10 can be made of a material having conductivity, and aluminum, polysilicon, or the like is used. The conductor 10 is connected to the source electrode 7 via a wiring. The source electrode 7 and the conductor 10 are kept at the same potential. The conductor 10 may not be directly connected to the source electrode 7, as long as the conductor is configured to be kept at the same potential as the source electrode 7.

The fourth semiconductor layer 4 is an N-type semiconductor layer which is formed from a region adjacent to the third semiconductor layer 3 in the depth direction Y to the surface of a region adjacent to the third semiconductor layer 3 in the surface direction X. The impurity concentration of the fourth semiconductor layer 4 is set to be higher than that of the third semiconductor layer 3 (the N-type semiconductor layer 3A and the N-type semiconductor layer 3B).

Specifically, the fourth semiconductor layer 4 is a layer having a substantially L-shaped cross-section which extends from below the third semiconductor layer 3 to the surface Sa of the semiconductor substrate S along an end portion distant from the surface Sa of the semiconductor substrate S among end portions in the depth direction Y of the third semiconductor layer 3 (i.e. an end portion at the back surface (Sb) side of the semiconductor substrate S) and an end portion distant from the second semiconductor layer 2 among end portions in the surface direction X of the third semiconductor layer 3 (i.e. right end).

In the example illustrated in FIG. 1, the fourth semiconductor layer 4 includes an N-type semiconductor layer 4A and an N-type semiconductor layer 4B which is formed at the N-type semiconductor layer 4A and has an impurity concentration higher than that of the N-type semiconductor layer 4A.

The N-type semiconductor layer 4B is an impurity region which extends in the depth direction Y from the surface of the semiconductor substrate S in a region adjacent to the third semiconductor layer 3 in the surface direction X. The N-type semiconductor layer 4B is made of, for example, polysilicon. In the example illustrated in FIG. 1, the N-type semiconductor layer 4B is formed to reach below a position of an end portion at the back surface (Sb) side of the semiconductor substrate S among end portions of the third semiconductor layer 3 in the depth direction Y.

The drain electrode 9 is connected to an end portion at the back surface (Sb) side of the semiconductor substrate S among end portions in the depth direction Y of the fourth semiconductor layer 4. A wiring is connected to the drain electrode 9, and the drain electrode 9 is kept at a predetermined potential via the wiring. The drain electrode 9 constitutes a third electrode connected to the fourth semiconductor layer 4.

The drain electrode 9 is not limited to the configuration illustrated in FIG. 1, as long as the drain electrode is connected to the fourth semiconductor layer 4 at a position closer to the back surface Sb of the semiconductor substrate S than the end portion at the back surface (Sb) side of the semiconductor substrate S among the end portions in the depth direction Y of the third semiconductor layer 3.

In FIG. 1, the thickness L2 of the insulating layer 6 between the conductor 10 and the surface Sa of the semiconductor substrate S is larger than the thickness L1 of the insulating layer 6 between the gate electrode 8 and the surface Sa of the semiconductor substrate S. The thickness L1 and the thickness L2 may be equal to each other or the thickness L1 may be larger than the thickness L2.

In FIG. 1, the distance L3 between the gate electrode 8 and the conductor 10 in the surface direction X is larger than the thickness L1. The distance L3 and the thickness L1 may be equal to each other or the thickness L1 may be larger than the distance L3.

In detail, the distance L3 is a distance between an end portion at the gate electrode (8) side among end portions in the surface direction X of the conductor 10 and an end portion at the conductor (10) side among end portions in the surface direction X of the gate electrode 8.

In FIG. 1, the distance L4 between the conductor 10 and a part of the fourth semiconductor layer 4 which is exposed to the insulating layer 6 at the surface Sa of the semiconductor substrate S in the surface direction X is set to be larger than the distance L3. The distance L4 and the distance L3 may be equal to each other or the distance L4 may be smaller than the distance L3.

In detail, the distance L4 is a distance between an end portion opposite to the gate electrode (8) side among the end portions in the surface direction X of the conductor 10 and an end portion at the third semiconductor layer (3) side among end portions in the surface direction X of a region on the right side of the third semiconductor layer 3 in the fourth semiconductor layer 4.

According to the MOSFET 100 having the above-mentioned configuration, in a state where the potential of the gate electrode 8 is controlled to form the channel in the second semiconductor layer 2, a current flows from the drain electrode 9 along a path in the order of the fourth semiconductor layer 4, the N-type semiconductor layer 3A, the N-type semiconductor layer 3B, a channel, and the first semiconductor layer 1.

In this way, the current supplied from the drain electrode 9 located in the vicinity of the back surface of the semiconductor substrate S reaches the surface Sa of the semiconductor substrate S via the fourth semiconductor layer 4. Then, the current flows to the first semiconductor layer 1 via the channel formed in the vicinity of the surface Sa. Accordingly, in comparison with a known structure in which a channel is formed in the semiconductor substrate, it is possible to set a current path to have low resistance and thus to easily realize low-voltage drive and low on-resistance.

Since the MOSFET 100 includes the conductor 10, it is possible to improve withstand voltage performance.

Figure 2:
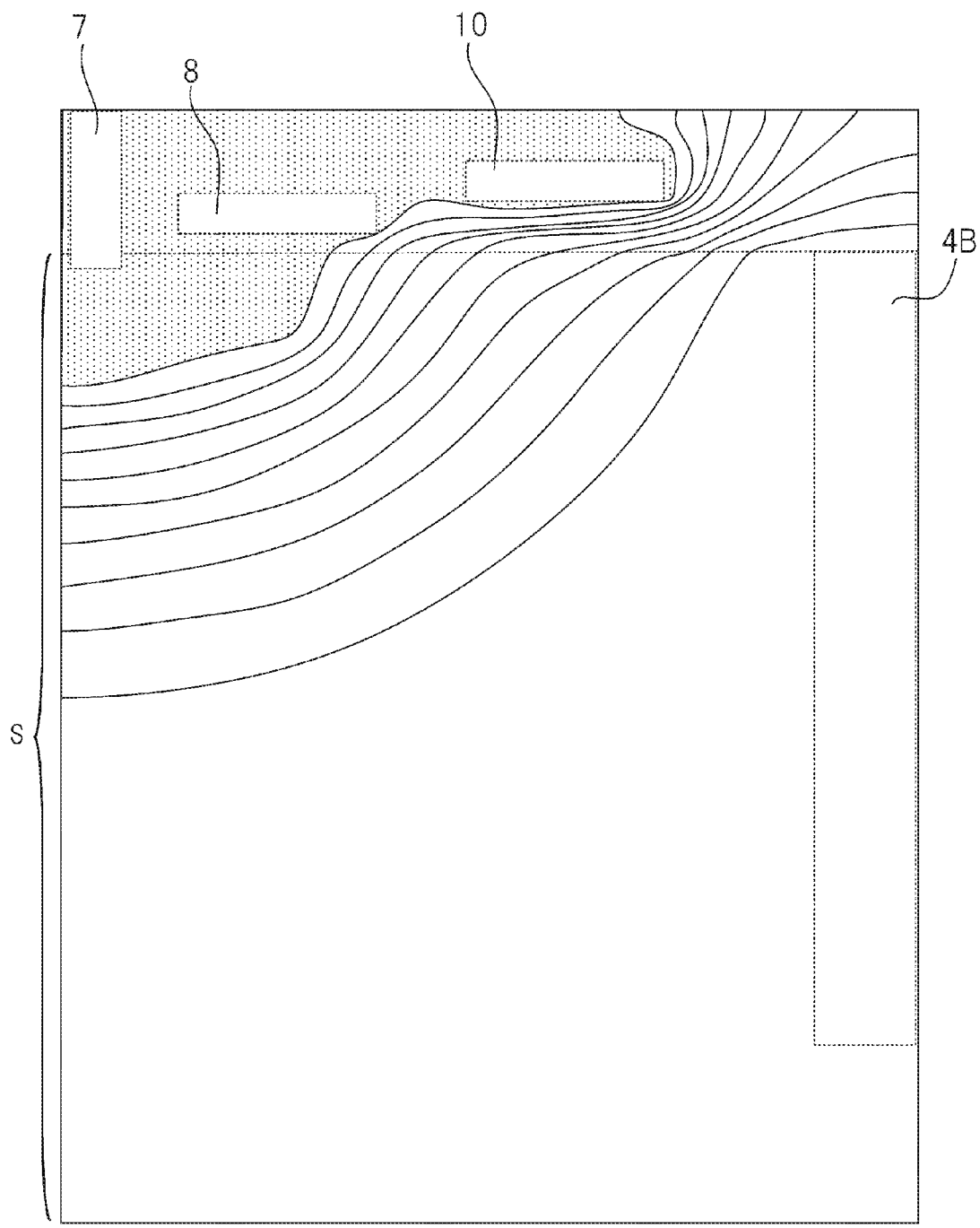
FIG. 2 is a diagram illustrating a result of a withstand voltage simulation of the MOSFET 100 illustrated in FIG. 1.
Figure 3:
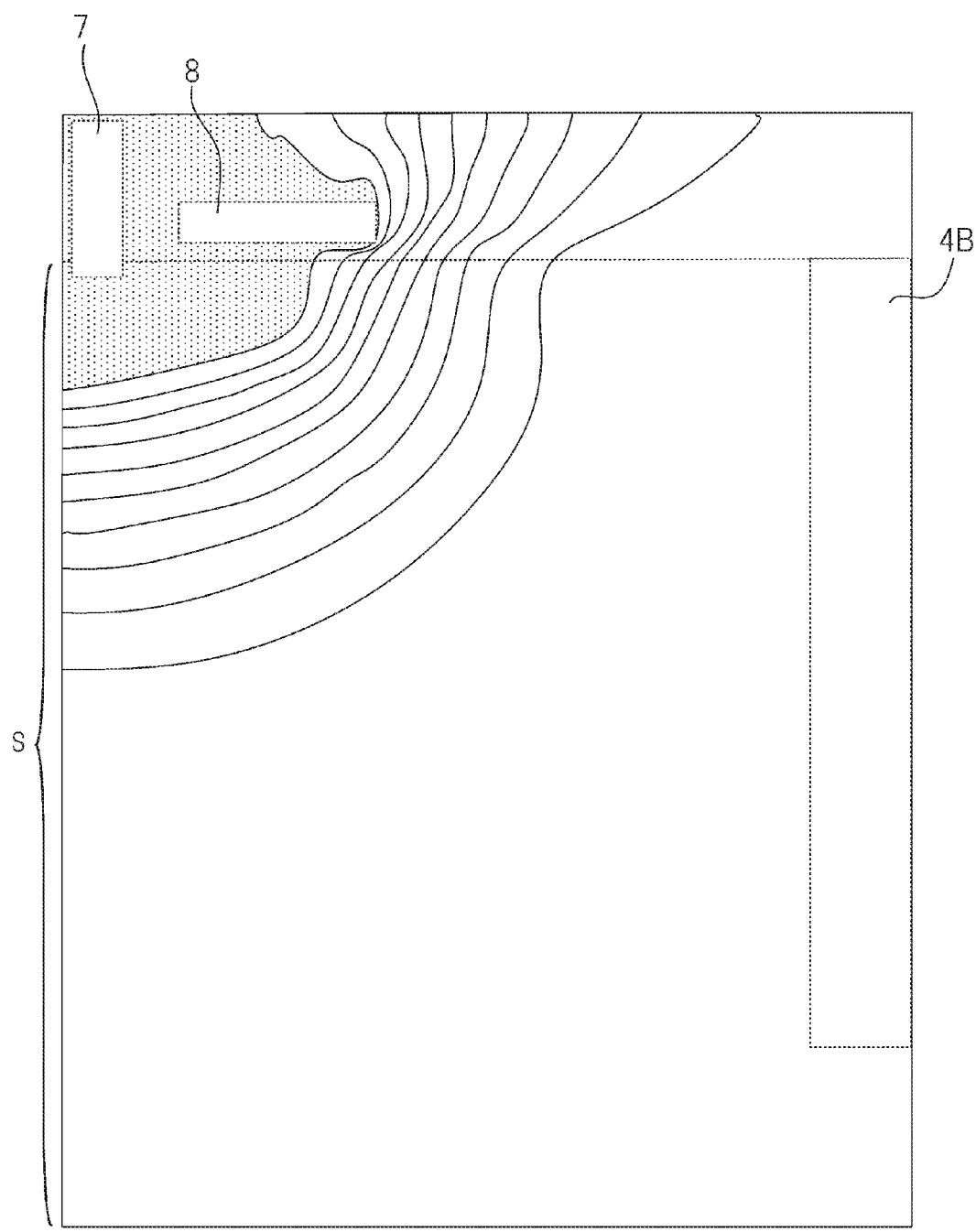
FIG. 3 is a diagram illustrating a withstand voltage simulation of a MOSFET having a configuration in which a conductor 10 is removed from the MOSFET 100 illustrated in FIG. 1.

FIG. 2 is a diagram illustrating a result of a withstand voltage simulation of the MOSFET 100 illustrated in FIG. 1. FIG. 3 is a diagram illustrating a result of a withstand voltage simulation of a MOSFET having a configuration in which the conductor 10 is removed from the MOSFET 100 illustrated in FIG. 1.

Hatched parts in FIGS. 2 and 3 denote regions having a reference potential (=0 V). In FIGS. 2 and 3, equipotential lines are illustrated based on the outer circumferential lines of the regions of the reference potential as a reference potential line. The potentials of the equipotential lines are higher, as they are separated away from the reference potential line. The pitch of the equipotential lines is small, as the field intensity is large.

As can be seen from a comparison result of FIGS. 2 and 3, since the region of the reference potential becomes larger due to addition of the conductor 10, it is possible to broaden the pitch of the equipotential lines in the semiconductor substrate S. As a result, it is possible to improve withstand voltage performance of the MOSFET 100.

Figure 4:
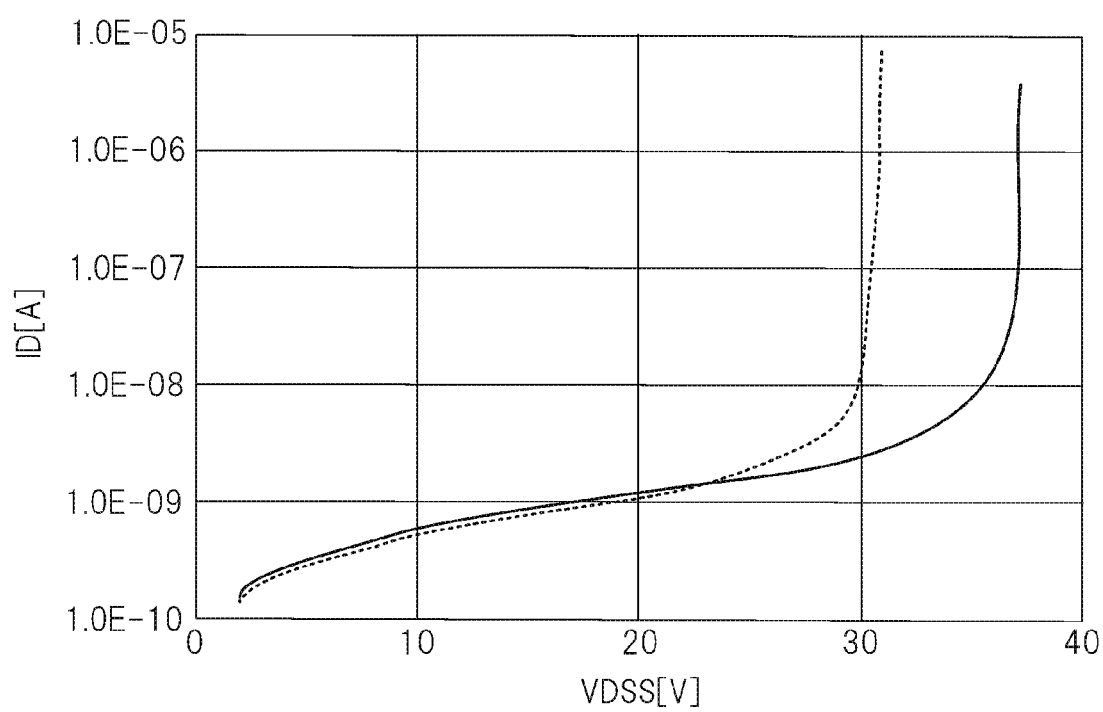
FIG. 4 is a graph illustrating a simulation result of withstand voltage performance of the MOSFETs illustrated in FIGS. 2 and 3.

FIG. 4 is a graph illustrating a result of a withstand voltage performance simulation of the MOSFETS in FIGS. 2 and 3. In FIG. 4, the horizontal axis represents a source-drain voltage and the vertical axis represents a drain current. In FIG. 4, a curve indicated by a solid line indicates characteristics of the MOSFET 100. In FIG. 4, a curve indicated by a dotted line indicates characteristics of the MOSFET having a configuration in which the conductor 10 is removed from the MOSFET 100. As illustrated in FIG. 4, the withstand voltage performance is improved by addition of the conductor 100.

As long as the conductor 10 is located above the part of the third semiconductor layer 3 which is exposed to the insulating layer 6 at the surface Sa of the semiconductor substrate S and is separated away from the gate electrode 8 in the surface direction X, it is possible to achieve an effect of improvement in withstand voltage.

In addition to the above-mentioned condition, in the MOSFET 100, the thickness L2 in FIG. 1 is larger than the thickness L1. According to this configuration, since source-drain capacitance can be decreased, it is possible to further improve withstand voltage performance.

In the MOSFET 100, the distance L3 in FIG. 1 is larger than the thickness L1. According to this configuration, since the source-gate capacitance can be increased, it is possible to further improve withstand voltage performance.

In the MOSFET 100, the distance L4 in FIG. 1 is larger than the distance L3. According to this configuration, since the effect of broadening of the pitch of the equipotential lines illustrated in FIG. 2 becomes more apparent, it is possible to effectively improve withstand voltage performance.

In the MOSFET 100, the N-type semiconductor layer 4B is formed in the fourth semiconductor layer 4. According to this configuration, it is possible to strongly draw up the drain current to the surface Sa of the semiconductor substrate S. As a result, it is possible to effectively decrease on-resistance.

Even in a case where the conductor 10 is removed from the MOSFET 100, it is possible to decrease the on-resistance by the operation of the N-type semiconductor layer 4B.

Even when the N-type semiconductor layer 4B of the MOSFET 100 illustrated in FIG. 1 is located above (i.e., does not extend below) the position of the end portion at the back surface (Sb) side among the end portions in the depth direction Y of the third semiconductor layer 3, the effect of decreasing the on-resistance can be obtained. According to the configuration illustrated in FIG. 1, it is possible to further draw up the drain current to the surface Sa of the semiconductor substrate S.

While a specific embodiment of this disclosure has been described above, the above-mentioned embodiment is only an example and this disclosure can be modified in various forms without departing from the gist of this disclosure.

For example, with a configuration in which the N-type semiconductor layers and the P-type semiconductor layers in the semiconductor layers in the semiconductor substrate S of the MOSFET 100 illustrated in FIG. 1 are reversed, it is possible to achieve the same advantages.

As described above, the following configurations are disclosed in this specification.

A disclosed semiconductor device includes: a first semiconductor layer that has a first conductivity type and is formed at a surface of a semiconductor substrate; an insulating layer that is formed on the surface of the semiconductor substrate; a first electrode that is electrically connected to the first semiconductor layer; a second semiconductor layer that has a second conductivity type opposite to the first conductivity type and is formed from a region, which is adjacent to the first semiconductor layer in the semiconductor substrate in a depth direction perpendicular to the surface of the semiconductor substrate, to a surface of a region, which is adjacent to the first semiconductor layer in one direction parallel to the surface of the semiconductor substrate; a second electrode that is formed above a part of the second semiconductor layer, which is exposed to the insulating layer at the surface of the semiconductor substrate, with the insulating layer interposed therebetween; a third semiconductor layer that has the first conductivity type and is formed from a region, which is adjacent to the second semiconductor layer in the depth direction, to a surface of a region, which is adjacent to the second semiconductor layer in the one direction; a fourth semiconductor layer that has the first conductivity type with an impurity concentration higher than that of the third semiconductor layer and is formed from a region, which is adjacent to the third semiconductor layer in the depth direction, to a surface of a region, which is adjacent to the third semiconductor layer in the one direction; a third electrode that is electrically connected to the fourth semiconductor layer at a position closer to a back surface of the semiconductor substrate than an end portion of the third semiconductor layer on the back surface side of the semiconductor substrate in the depth direction; and a conductor that is separated from the second electrode in the one direction, is formed above a part of the third semiconductor layer, which is exposed to the insulating layer at the surface of the semiconductor substrate, with an insulating layer interposed therebetween, and is kept at the same potential as the first electrode.

In the above-described semiconductor device, a thickness of the insulating layer between the conductor and the semiconductor substrate is larger than a thickness of the insulating layer between the second electrode and the semiconductor substrate.

In the above-described semiconductor device, a distance between the second electrode and the conductor in the one direction is larger than a thickness of the insulating layer between the second electrode and the semiconductor substrate.

In the above-described semiconductor device, a distance between the conductor and the part of the fourth semiconductor layer, which is exposed to the insulating layer at the surface of the semiconductor substrate, in the one direction is larger than a distance between the second electrode and the conductor in the one direction.

In the above-described semiconductor device, the fourth semiconductor layer includes a plurality of regions having different impurity concentrations, wherein an impurity region extending in the depth direction from the surface of the semiconductor substrate is formed in the fourth semiconductor layer adjacent to the third semiconductor layer in the one direction, and wherein the impurity concentration of the impurity region is higher than the impurity concentration of the regions of the fourth semiconductor layer other than the impurity region.

In the above-described semiconductor device, the impurity region is made of polysilicon.

A disclosed semiconductor device includes a first semiconductor layer that has a first conductivity type and is formed at a surface of a semiconductor substrate; an insulating layer that is formed on the surface of the semiconductor substrate; a first electrode that is electrically connected to the first semiconductor layer; a second semiconductor layer that has a second conductivity type opposite to the first conductivity type and is formed from a region, which is adjacent to the first semiconductor layer in the semiconductor substrate in a depth direction perpendicular to the surface of the semiconductor substrate, to a surface of a region, which is adjacent to the first semiconductor layer in one direction parallel to the surface of the semiconductor substrate; a second electrode that is formed above a part of the second semiconductor layer, which is exposed to the insulating layer at the surface of the semiconductor substrate, with the insulating layer interposed therebetween; a third semiconductor layer that has the first conductivity type and is formed from a region, which is adjacent to the second semiconductor layer in the depth direction, to a surface of a region, which is adjacent to the second semiconductor layer in the one direction; a fourth semiconductor layer that has the first conductivity type with an impurity concentration higher than that of the third semiconductor layer and is formed from a region, which is adjacent to the third semiconductor layer in the depth direction, to a surface of a region, which is adjacent to the third semiconductor layer in the one direction; and a third electrode that is electrically connected to the fourth semiconductor layer at a position closer to a back surface of the semiconductor substrate than an end portion of the third semiconductor layer on the back surface side of the semiconductor substrate in the depth direction; wherein the fourth semiconductor layer includes a plurality of regions having different impurity concentrations, wherein an impurity region extending in the depth direction from the surface of the semiconductor substrate is formed in the fourth semiconductor layer adjacent to the third semiconductor layer in the one direction, and wherein the impurity concentration of the impurity region is higher than the impurity concentration of the regions of the fourth semiconductor layer other than the impurity region.

In the above-described semiconductor device, the impurity region is made of polysilicon.

What is claimed is:

1. A semiconductor device comprising:
    a first semiconductor layer that has a first conductivity type and is formed at a surface of a semiconductor substrate;
    an insulating layer that is formed on the surface of the semiconductor substrate;
    a first electrode that is electrically connected to the first semiconductor layer;
    a second semiconductor layer that has a second conductivity type opposite to the first conductivity type and is formed from a first region, which is adjacent to the first semiconductor layer in the semiconductor substrate in a depth direction perpendicular to the surface of the semiconductor substrate, to a second region, which is in contact with the surface of the semiconductor substrate and is adjacent to the first semiconductor layer in one direction parallel to the surface of the semiconductor substrate;
    a second electrode that is formed above a part of the second semiconductor layer, which is exposed to the insulating layer at the surface of the semiconductor substrate, with the insulating layer interposed therebetween;
    a third semiconductor layer that has the first conductivity type and is formed from a third region, which is adjacent to the second semiconductor layer in the depth direction, to a fourth region, which is in contact with the surface of the semiconductor substrate and is adjacent to the second semiconductor layer in the one direction;
    a fourth semiconductor layer that has the first conductivity type with an impurity concentration higher than that of the third semiconductor layer and is formed from a fifth region, which is adjacent to the third semiconductor layer in the depth direction, to a sixth region, which is in contact with the surface of the semiconductor substrate and is adjacent to the third semiconductor layer in the one direction;
    a third electrode that is electrically connected to the fourth semiconductor layer at a position closer to a back surface of the semiconductor substrate than an end portion of the third semiconductor layer on a back surface side of the semiconductor substrate in the depth direction; and
    a conductor that is separated from the second electrode in the one direction, is formed above a part of the third semiconductor layer, which is exposed to the insulating layer at the surface of the semiconductor substrate, with an insulating layer interposed therebetween, and is kept at the same potential as the first electrode, wherein the third semiconductor layer includes a first impurity region, which is in contact with the surface of the semiconductor substrate and is separated from the second semiconductor layer in the one direction, and a second impurity region, a part of which is in contact with the surface of the semiconductor substrate and is provided between the second region of the second semiconductor layer and the first impurity region, wherein the first impurity region has an impurity concentration higher than an impurity concentration of the second impurity region, and wherein a width of the second electrode in the one direction is less than a width of the first impurity region in the one direction.

2. The semiconductor device according to claim 1, wherein a thickness of the insulating layer between the conductor and the semiconductor substrate is larger than a thickness of the insulating layer between the second electrode and the semiconductor substrate.

3. The semiconductor device according to claim 1, wherein a distance between the second electrode and the conductor in the one direction is larger than a thickness of the insulating layer between the second electrode and the semiconductor substrate.

4. The semiconductor device according to claim 1, wherein a distance between the conductor and the part of the fourth semiconductor layer, which is exposed to the insulating layer at the surface of the semiconductor substrate, in the one direction is larger than a distance between the second electrode and the conductor in the one direction.

5. The semiconductor device according to claim 1, wherein the fourth semiconductor layer includes a plurality of regions having different impurity concentrations, wherein an impurity region extending in the depth direction from the surface of the semiconductor substrate is formed in the fourth semiconductor layer adjacent to the third semiconductor layer in the one direction, and wherein the impurity concentration of the impurity region is higher than the impurity concentration of the regions of the fourth semiconductor layer other than the impurity region.

6. The semiconductor device according to claim 5, wherein the impurity region is made of polysilicon.

7. The semiconductor device according to claim 1, wherein the second electrode is located within a range of the first impurity region in the one direction.

8. The semiconductor device according to claim 1, wherein a highest impurity concentration in the third semiconductor layer is lower than a lowest impurity concentration in the fourth semiconductor layer.

9. The semiconductor device according to claim 1, wherein the second electrode is not overlapped with the conductor in the depth direction perpendicular to the surface of the semiconductor substrate.

10. The semiconductor device according to claim 1, wherein a distance between the conductor and the first electrode in the one direction is larger than a distance between the second electrode and the conductor in the one direction.

* * * * *